United States Patent
Marinaro et al.

(10) Patent No.: US 6,418,946 B1
(45) Date of Patent: Jul. 16, 2002

(54) APPARATUS FOR AUTOMATICALLY CLEANING RESIST NOZZLE

(75) Inventors: Vincent L. Marinaro, Sunnyvale; Eric Kent, San Jose; Ted Wakamiya, San Ramon, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/756,615

(22) Filed: Jan. 5, 2001

Related U.S. Application Data

(62) Division of application No. 09/510,411, filed on Feb. 22, 2000, now Pat. No. 6,170,494.
(60) Provisional application No. 60/165,069, filed on Nov. 12, 1999.

(51) Int. Cl.$^7$ ................................................. B08B 3/02
(52) U.S. Cl. ........................ 134/166 R; 134/22.1; 134/22.11; 134/22.14; 134/22.18; 134/22.19; 134/25.4; 134/42; 134/170; 134/169 R; 134/171; 134/198; 134/199; 422/99; 422/100
(58) Field of Search .................... 134/170, 171, 134/198, 199, 166 R, 169 R, 22.1, 22.11, 22.14, 22.18, 22.19, 25.4, 42; 422/99, 100

(56) References Cited

U.S. PATENT DOCUMENTS

| | | | | |
|---|---|---|---|---|
| 2,827,063 A | * | 3/1958 | Roy | 134/171 |
| 4,730,631 A | * | 3/1988 | Schwartz | 134/155 |
| 4,820,497 A | * | 4/1989 | Howell | 422/63 |
| 4,923,522 A | * | 5/1990 | Sowers | 134/22.1 |
| 4,977,911 A | * | 12/1990 | Vetter | 134/34 |
| 5,405,087 A | * | 4/1995 | Waryu et al. | 239/288 |
| 5,658,615 A | * | 8/1997 | Hasebe et al. | 427/240 |
| 5,718,763 A | * | 2/1998 | Tateyama et al. | 118/52 |
| 5,814,158 A | * | 9/1998 | Hollander et al. | 134/3 |
| 5,827,744 A | * | 10/1998 | Fose et al. | 436/49 |
| 5,941,456 A | * | 8/1999 | Waryu et al. | 239/112 |
| 5,964,257 A | * | 10/1999 | Lin et al. | 134/170 |
| 5,966,635 A | * | 10/1999 | Hiatt et al. | 438/905 |
| 6,015,467 A | * | 1/2000 | Nagasawa et al. | 134/1 |
| 6,170,494 B1 | * | 1/2001 | Marinaro et al. | 134/22.18 |

* cited by examiner

*Primary Examiner*—Sharidan Carrillo
(74) *Attorney, Agent, or Firm*—Foley & Lardner

(57) ABSTRACT

An apparatus for cleaning dried photoresist from a photoresist dispensing nozzle. The tip of the photoresist dispensing nozzle is inserted through an opening in a nozzle base. A catch pan is positioned beneath the nozzle base. A solvent dispensing needle is inserted through an opening in the catch pan to face the photoresist dispensing nozzle tip and sprays solvent onto the photoresist dispensing nozzle tip. The catch pan collects the solvent and dissolved photoresist particles. The catch pan includes a drain for draining the solvent and the dissolved photoresist particles.

3 Claims, 2 Drawing Sheets

APPARATUS FOR AUTOMATICALLY CLEANING RESIST NOZZLE

REFERENCE TO PROVISIONAL APPLICATION

This application claims the benefit of U.S. Provisional Application No. 60/165,069, filed Nov. 12, 1999. The application is a divisional application of Ser. No. 09/510,411 filed Feb. 22, 2000, now U.S. Pat. No. 6,170,494.

BACKGROUND OF THE INVENTION

1. Field of the Invention

The invention relates generally to a cleaning apparatus for nozzles used in semiconductor processes and, more particularly, to a cleaning apparatus for photoresist dispensing nozzles, the cleaning apparatus having a cleaning solvent inlet that is positioned and configured to squirt the cleaning solvent directly onto the photoresist dispensing nozzles.

2. Description of the Related Art

Photoresist used during photolithography is dispensed onto semiconductor wafers using a plurality of nozzles. When these nozzles are not being used, they are returned to their home positions. The home positions of the nozzles correspond to their storage locations in a cleaning apparatus.

A conventional cleaning apparatus 10 in which the nozzles are stored is illustrated in FIG. 1 as an exploded view. The cleaning apparatus 10 includes a nozzle base 20, a thinner pot 30, a solvent bath or catch pan 40, and a drain 50. Each of these components has openings corresponding to four photoresist dispensing nozzles 11, 12, 13, 14.

In their home positions, the photoresist dispensing nozzles 11–14 are inserted into corresponding openings 21, 22, 23, 24 of the nozzle base 20. The tips of the nozzles, when inserted, extend into corresponding openings 31, 32, 33, 34 of the thinner pot 30, near the bottom of the thinner pot 30, as shown in FIG. 2, which shows a side cross-sectional view of the conventional cleaning apparatus 10.

While the nozzles are in their home position, photoresist that remains in the nozzles dries up and begins to clog them up, especially at the tip and when the nozzles sit idle for any length of time. When any one of such nozzles is used to dispense photoresist during the photolithography process, dried photoresist particles become dispensed onto the semiconductor wafer and leads to defects. In some cases, little or no photoresist is dispensed due to clogging.

Three different techniques have been used to combat this problem. First, maintenance technicians remove the nozzles and manually clean each nozzle with a photoresist cleaning solvent. Second, the nozzles undergo a dummy dispense procedure. In this procedure, the photoresist is dispensed through the nozzles while they are in their home positions. This procedure keeps the nozzle tips continuously wet in an effort to prevent the photoresist remaining at the nozzle tips from drying up. The dispensed photoresist is dumped through the drain 50. Third, photoresist cleaning solvent is introduced through an inlet 60. The cleaning solvent that is introduced floods the solvent catch pan 40 but does not come in contact with the nozzles. At best, the nozzles are moistened from the solvent vapors, but this is not sufficient to prevent the nozzle from clogging.

SUMMARY OF THE INVENTION

The invention provides a cleaning apparatus for photoresist dispensing nozzles which has one or more solvent needles positioned to oppose corresponding nozzle or nozzles that are stored in their home positions so that, as photoresist cleaning solvent is introduced through the needles, the photoresist cleaning solvent is squirted directly at the nozzles to clean the nozzles and keep them from clogging. The squirting of the photoresist cleaning solvent through the needles preferably occurs at a specified interval to prevent the photoresist remaining in the nozzles from drying up.

Additional objects, features and advantages of the invention will be set forth in the description of preferred embodiments which follows.

BRIEF DESCRIPTION OF THE DRAWINGS

The invention is described in detail herein with reference to the drawings in which.

The accompanying drawings, which are incorporated in and constitute a part of the specification, illustrate presently preferred exemplary embodiments of the invention, and, together with the general description given above and the detailed description of the preferred embodiments given below, serve to explain the principles of the invention.

DETAILED DESCRIPTION OF THE PREFERRED EMBODIMENTS

Figure 1:
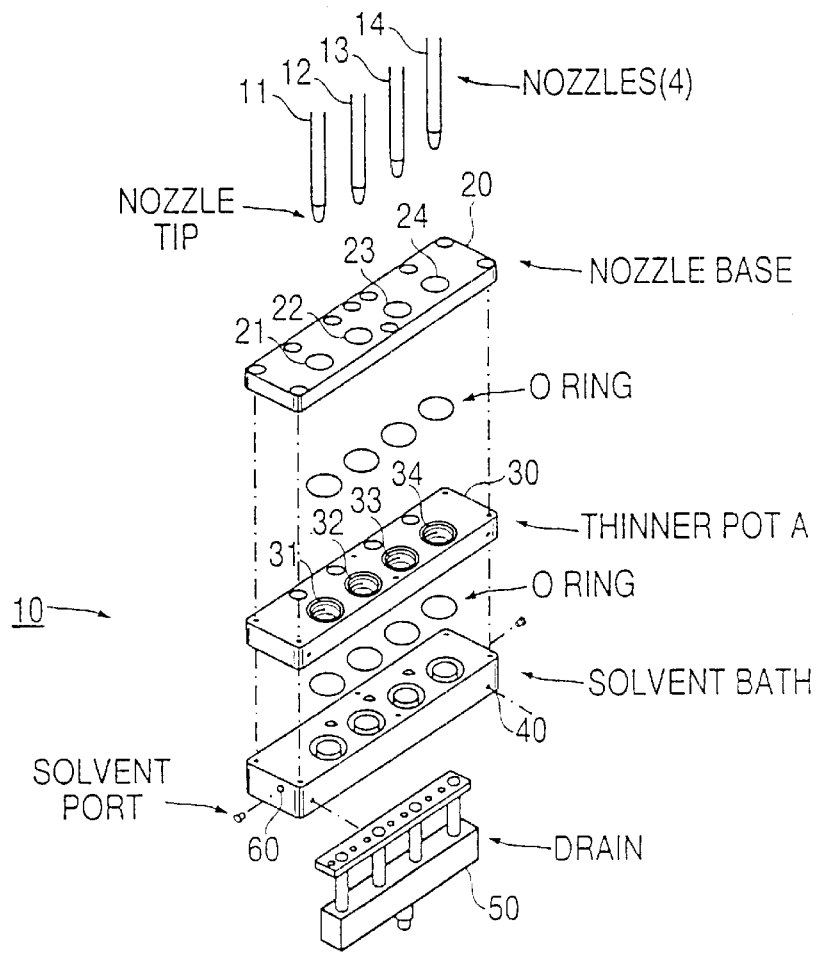
FIG. 1 is an exploded view of a conventional cleaning apparatus for photoresist dispensing nozzles.
Figure 2:
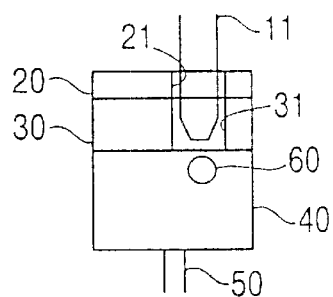
FIG. 2 is a side cross-sectional view of a conventional cleaning apparatus for photoresist dispensing nozzles.
Figure 3:
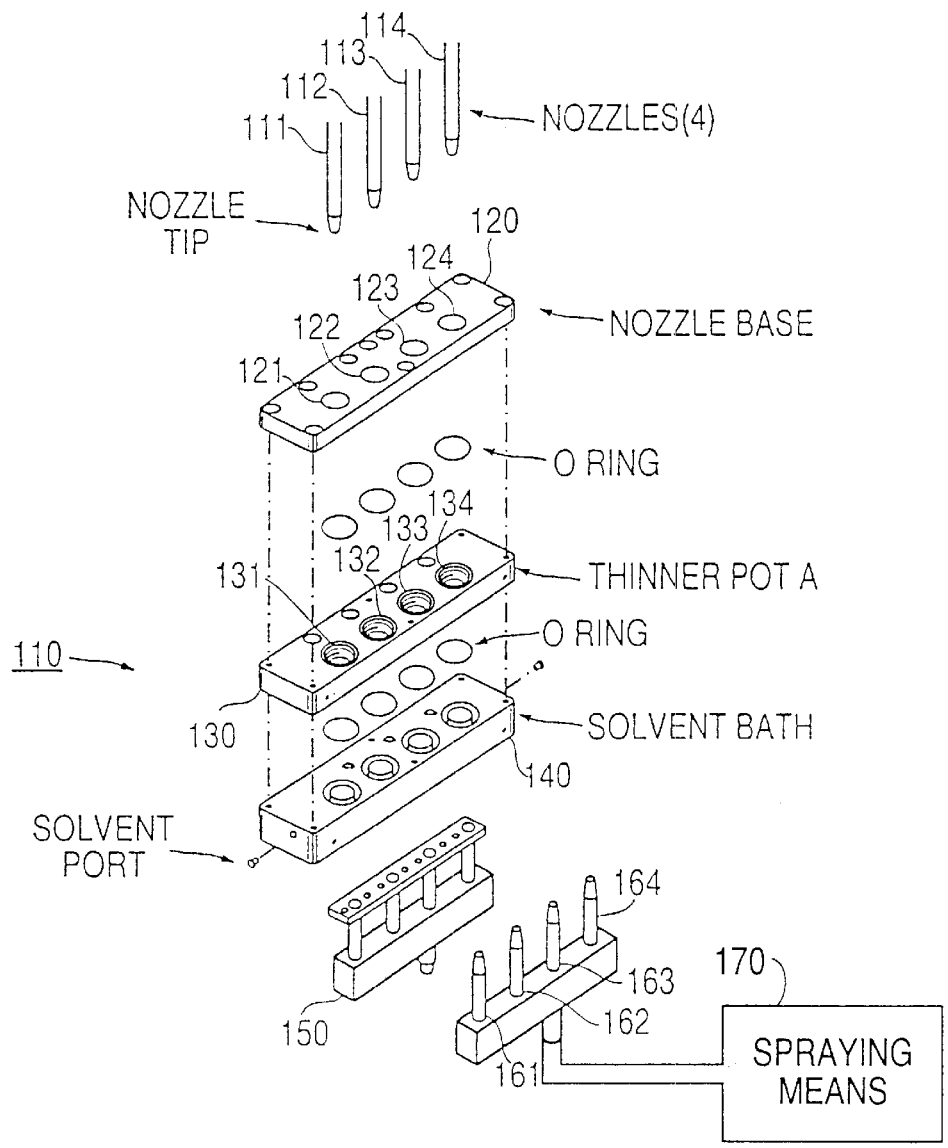
FIG. 3 is an exploded view of a cleaning apparatus for photoresist dispensing nozzles according to an embodiment of the invention.

FIG. 3 illustrates a cleaning apparatus 110 according to an embodiment of the invention. The cleaning apparatus 110 includes a nozzle base 120, a thinner pot 130, a solvent bath or catch pan 140, and a drain 150. Each of these components has openings corresponding to four photoresist dispensing nozzles 111, 112, 113, 114.

In their home positions, the photoresist dispensing nozzles 111–114 are inserted into corresponding openings 121, 122, 123, 124 of the nozzle base 120. The tips of the nozzles, when inserted, extend into corresponding openings 131, 132, 133, 134 of the thinner pot 130, near the bottom of the thinner pot 130, as shown in FIG. 4, which shows a side cross-sectional view of the cleaning apparatus 110.

When the nozzles 111–114 are stored in their home positions, the nozzle tips may become clogged up with dried up photoresist particles. To clean the nozzles 111–114, solvent needles 161, 162, 163, 164 are provided underneath the tip of each nozzle 111–114. The solvent needles 161–164 are inserted into corresponding openings at the bottom of the solvent pan 140. The solvent needles are in communication with a means 170 for spraying photoresist cleaning solvent through the needles.

Figure 4:
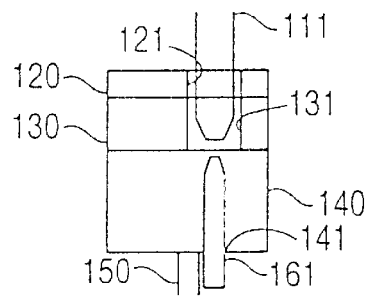
FIG. 4 is a side cross-sectional view of a cleaning apparatus for photoresist dispensing nozzles according to an embodiment of the invention.

FIG. 4 shows the solvent needle 161 inserted into the opening 141 at the bottom of the solvent catch pan 140. The solvent needle 161 extends sufficiently far into the solvent catch pan 140 so that photoresist cleaning solvent, for example PGMEA (propylene glycol mono methyl ether acetate), introduced therethrough comes in direct contact with the tip of the nozzle 111. Preferably, the size of the solvent needle opening is selected so that the photoresist cleaning solvent forms a spray as it exits the opening and the spray comes in direct contact with the tips of the nozzle 111 to clean it and to prevent it from clogging up. The excess photoresist cleaning solvent and the dissolved photoresist are collected by the solvent catch pan 140 and discharged through the drain 150. The other solvent needles 162–164 are inserted into their corresponding openings and operated in a like manner.

Other methods of producing the solvent spray may be used. For example, in place of the needles 161–164, the photoresist cleaning solvent may be introduced through spray nozzles or other openings through which an increased flow rate can be achieved. Further, the spraying or squirting of the photoresist cleaning solvent preferably occurs at a specified interval to prevent the photoresist remaining in the nozzles from drying up.

While particular embodiments according to the invention have been illustrated and described above, it will be clear that the invention can take a variety of forms and embodiments within the scope of the appended claims.

We claim:

1. An apparatus for cleaning a photoresist dispensing nozzle comprising:

at least one photoresist dispensing nozzle having a tip, said tip being clogged with dried up photoresist particles;

a nozzle base having at least one opening and positioned beneath said at least one photoresist dispensing nozzle, such that said tip of said photoresist dispensing nozzle is inserted through said opening of said nozzle base;

a catch pan having an opening, said catch pan positioned beneath said nozzle base such that said opening of said catch pan faces said tip of said at least one photoresist dispensing nozzle;

a solvent dispensing needle having an opening, said solvent dispensing needle inserted into said opening of said catch pan such that said opening of said solvent dispensing needle faces said tip of said photoresist dispensing nozzle; and means in communication with said solvent dispensing needle for spraying photoresist cleaning solvent upwardly through said opening of said solvent dispensing needle directly onto said tip of said photoresist dispensing nozzle and for dissolving the dried up photoresist particles while said tip of said photoresist dispensing nozzle is inserted through said opening of said nozzle base;

wherein said catch pan collects the photoresist cleaning solvent and the dissolved photoresist particles and said catch pan includes a drain for draining the photoresist cleaning solvent and the dissolved photoresist particles from said catch pan.

2. The nozzle cleaning apparatus according to claim 1, wherein the nozzle base includes additional openings to receive additional photoresist dispensing nozzles for storage.

3. The nozzle cleaning apparatus according to claim 2, further comprising additional solvent dispensing needles positioned in said catch pan to apply photoresist cleaning solvent directly onto said additional photoresist dispensing nozzles when said additional photoresist dispensing nozzles are received in the additional openings of said nozzle base.

\* \* \* \* \*